United States Patent [19]

Kakimoto

[11] Patent Number: 4,990,080
[45] Date of Patent: Feb. 5, 1991

[54] PUNCH PRESS FOR PIERCING GREEN SHEET WITH LINER

[75] Inventor: Masakazu Kakimoto, Aichi, Japan

[73] Assignee: Ushio Co. Ltd., Aichi, Japan

[21] Appl. No.: 370,874

[22] Filed: Jun. 23, 1989

[30] Foreign Application Priority Data

Jun. 29, 1988 [JP] Japan ................................ 63-163186
Jun. 29, 1988 [JP] Japan ................................ 63-163187

[51] Int. Cl.⁵ ................................................ B29C 53/58
[52] U.S. Cl. ...................................... 425/290; 156/89; 83/409
[58] Field of Search ............... 83/685, 686, 690, 409, 83/451, 618, 559; 156/89, 252, 253, 510, 231, 246, 247, 261, 250; 425/290; 264/67, 177.11, 155, 156

[56] References Cited

U.S. PATENT DOCUMENTS

| 3,097,929 | 7/1963 | Ragan ........................... 264/267 |
| 3,518,756 | 7/1970 | Bennett et al. ................. 156/89 |
| 3,891,735 | 6/1975 | North ............................. 264/60 |
| 3,956,052 | 5/1976 | Koste et al. ................... 156/247 |
| 4,094,944 | 6/1978 | Paetz ............................. 156/261 |
| 4,106,181 | 8/1978 | Brolund et al. .............. 83/409 |
| 4,443,278 | 4/1984 | Zingher .......................... 156/89 |
| 4,532,843 | 8/1985 | Miyama ........................... 83/409 |
| 4,539,058 | 9/1985 | Burgess et al. ................ 156/250 |
| 4,612,407 | 11/1986 | Suzuki ............................ 29/568 |
| 4,653,365 | 3/1987 | Takasaki et al. ............. 83/50 |
| 4,674,373 | 6/1987 | Kuppinger ..................... 83/559 |
| 4,786,342 | 11/1988 | Zellner et al. ............... 264/267 |

FOREIGN PATENT DOCUMENTS 63-267195 11/1988 Japan .

Primary Examiner—Willard E. Hoag
Attorney, Agent, or Firm—Sandler, Greenblum & Bernstein

[57] ABSTRACT

A punch press machine for piercing a so-called green sheet made from a ceramic compound formed as a thin tape utilized for IC substrate and the like after sintering for solidification. The green sheet is adhered to a liner, such as a plastic tape, and has a core portion. The punch press machine is capable of piercing the green sheet together with the liner, without peeling of the tape liner from the core portion of green sheet. The machine consists of a punch press section, a work piece feeding section and a drive mechanism to move the work piece feeding section or the punch press section under mechanical automation, thus facilitating the piercing work with high productiviey and quality.

23 Claims, 6 Drawing Sheets

PUNCH PRESS FOR PIERCING GREEN SHEET WITH LINER

BACKGROUND OF THE INVENTION

1. Field of the Invention

This invention relates to a punch press for piercing a ceramics type green sheet, more particularly to an improvement of a punching press machine for piercing various forms and sized perforations passing through upon its surface of the green sheet before sintering process in the art of utilizing it for IC substrates and the like.

2. Description of the Prior Art

Conventionally, it is known that a green sheet is formed as a thin sheet by the so-called Doctor blade method or Calendar method, which is made from a mixture of compounds including pulverized ceramics, an organic bonding agent, a plasticizer, a solvent and the like. The raw sheet before sintering has a rich plasticity, flexibility and workability. Therefore, it is known that it can be easily cut-off, drilled, punched, bonded and the like, thus useful for IC substrate and the like pursuant to a sintering process in the art.

As a process conception for making a green sheet, for example, initially a raw material of ceramic compound is coated on a tape (such as a polyester resin film and the like) uniformly with a predetermined thickness, and then dried in ordinary course. Secondly, the ceramic sheet layer is peeled off from the tape for obtaining a green sheet slip shown as a green color namely, wherein it is passed to a piercing process by using an exclusive type punch press machine.

In the above conventional means of piercing the green sheet, however, it has such a disadvantage that since the thickness of the green sheet which has been peeled off from the tape is too thin approximately 0.1 mm), the handling of the green sheet is so troublesome as its workability in the spot, consequently there is no way to improve the productivity and the perforation work is seriously difficult.

SUMMARY OF THE INVENTION

The present invention, therefore, has been achieved to solve the aforementioned disadvantage, it is a general object of this invention to provide a punch press to pierce the green sheet together with the tape, that is, without any peeling-off the raw core of green sheet from the tape. It is a further object of this invention to provide a further improved apparatus to obtain a more high grade products.

According to the above objects of the present invention, a punch press for piercing the green sheet comprises a plurality of piercing assemblies consisting of piercing punches and female dies have various shapes and sizes applicable to IC substrate and the like which are loaded into a punch press frame mechanism; a punch press frame mechanism with the piercing assembly therein arranged parallel to x-axis direction; green sheet web loaded into a housing on a first bobbin facing a second bobbin on which is coiled a web of pierced green sheet with the punch press frame mechanism between, the unprocessed green sheet on one side is fed intermittently onto the second bobbin web capstan in response to each shot by the punching action of punch press mechanism; a work piece feeding mechanism provided to load a pair of the above webs in its housing so as to stretch the green sheet between both webs; and a drive mechanism provided to move the above feeding section in the x-axis direction and/or y-axis direction.

As another practical example, it is also provided to drive the punch press frame section instead of the feeding mechanism.

Summarizing from the above two examples, firstly it is another object of the present invention to provide a punch press in combination with a stationary punch press frame section and a movable feeding mechanism as explained in the first example.

Secondly it is an additional object of the present invention to provide a punch press in combination with a movable punch press frame section and a stationary feeding mechanism.

DETAILED DESCRIPTION OF THE PREFERRED EMBODIMENT

Reference will be made now in detail to a practical example of a punch press which is characterized in combination with a stationary punch press frame section and a movable feeding mechanism as provided in the first object of the present invention.

Figure 1:
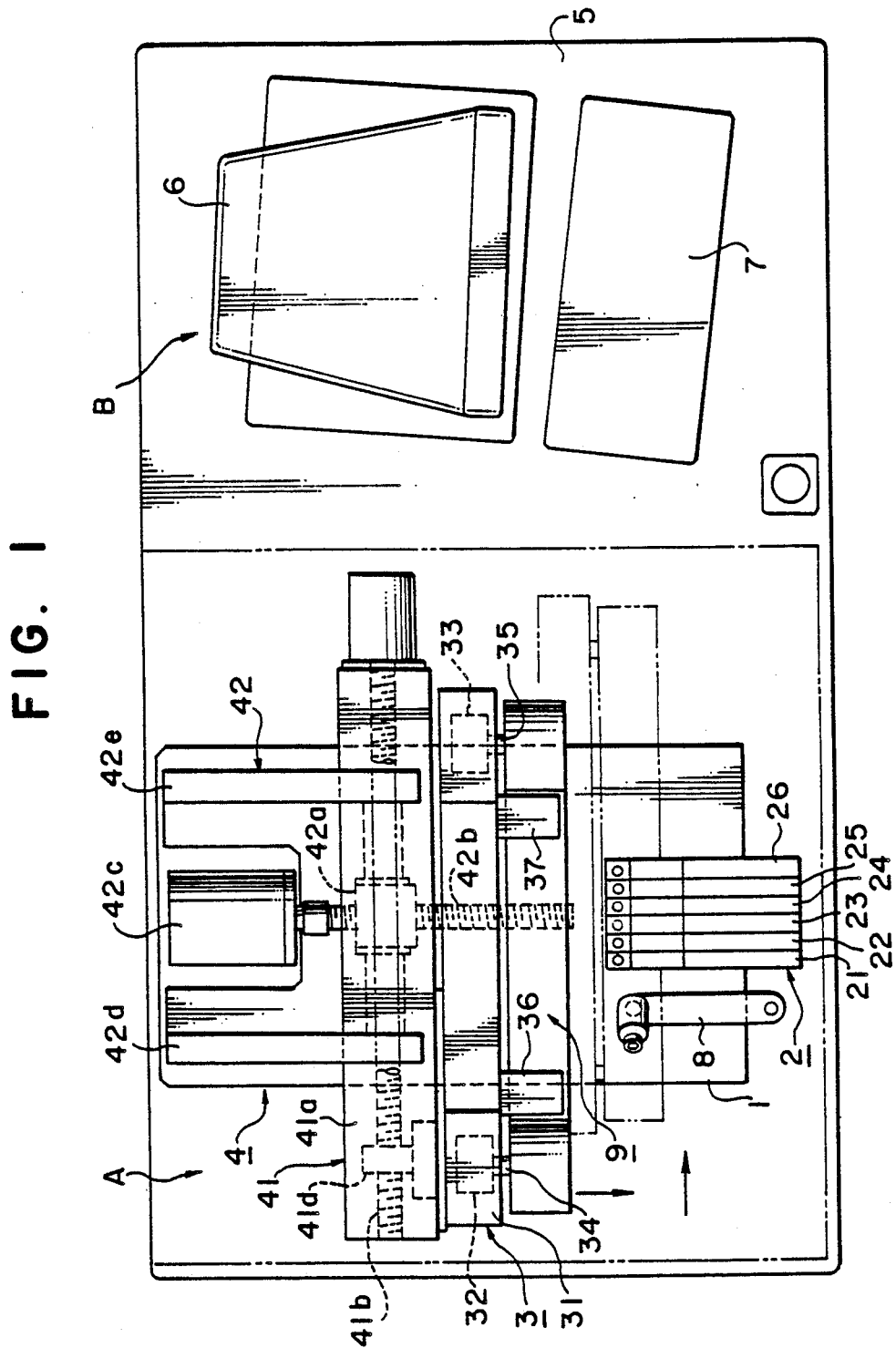
FIG. 1 is a plan view for showing a practical example a punch press.
Figure 2:
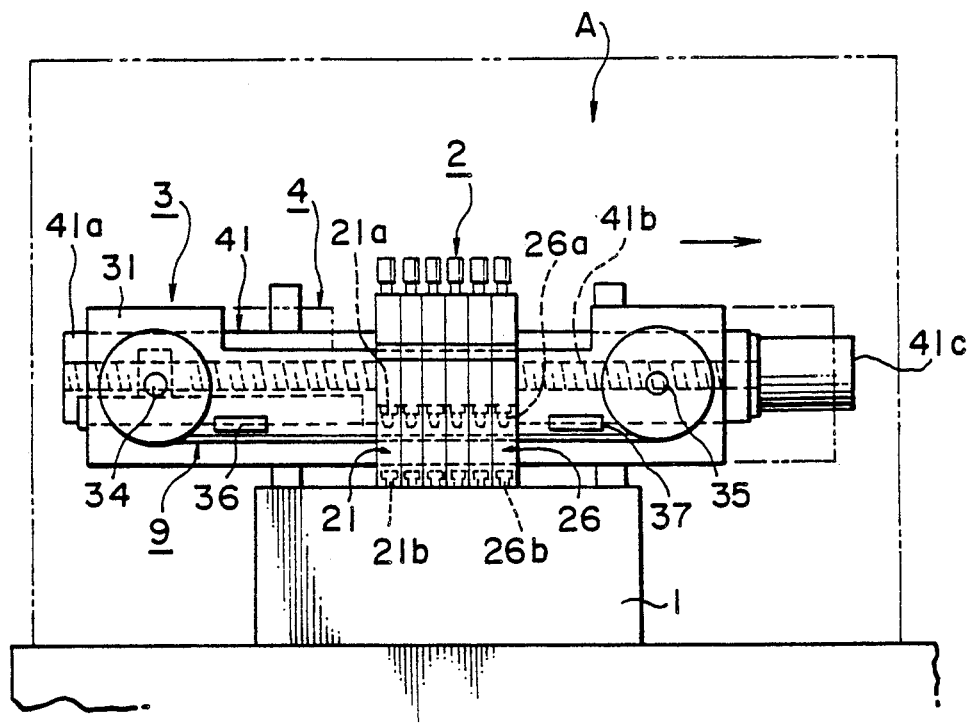
FIG. 2 is a partial front elevation of FIG. 1.
Figure 3:
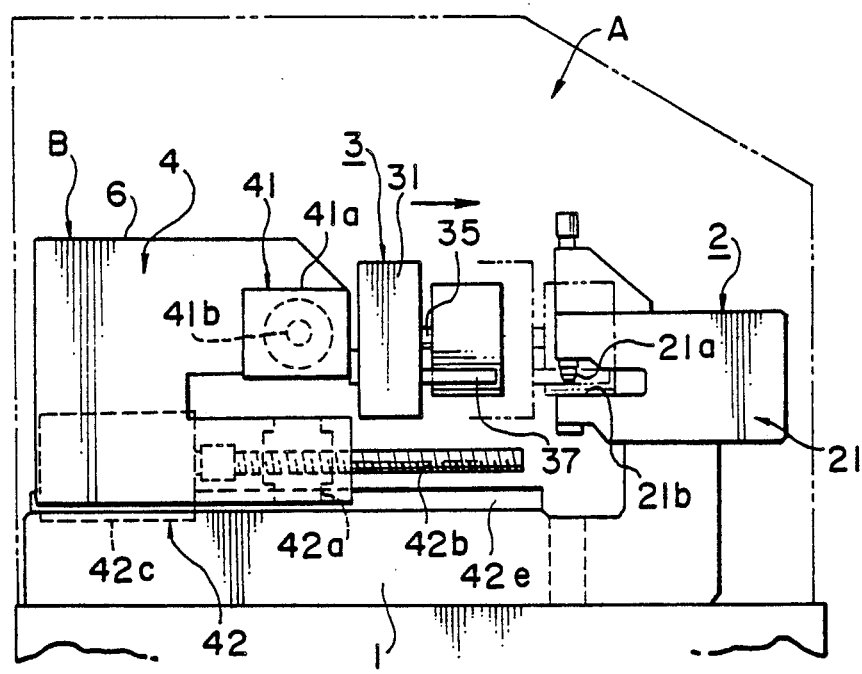
FIG. 3 is a side view of FIG. 1.

In FIG. 1, as a total system of the punch press, it comprises a working section (A) and a control section (B) which controls the total system.

The working section (A) is arranged on a bed (1), which consists of the punch press frame section (2), the feeding mechanism (3) and the drive mechanism (4). The punch press frame section (2) is provided to perform a piercing work to the green sheet (9), and is equipped with six units of piercing assemblies as shown in (21), (22), (23), (24), (25) and (26) which consists of six piercing punches (21a), (22a), (23a), (24a), (25a) and (26a) and also the same numbers of female dies (21b), (22b), (23b), (24b), (25b) and (26b). The punch press frame section is arranged on the bed (1) and the piercing assemblies are arranged so as to align the x-axis direction therein. It is admitted to load a plurality of piercing assemblies into the punch press frame section. The punch press frame section has an adequate percussion mechanism to impact the piercing punches toward the female dies through a slip shaped work piece between, that is, the green sheet with a liner.

The work piece feeding mechanism (3) is provided to hold the work piece drawn out from a web consisting of the green sheet with a liner on a bobbin and feeds into the punch press frame section (2), and consists of; a housing (31), a feeding motor (32) and a coiling motor (33) disposed within the housing (31) for feeding and coiling the work piece from web on a first bobbin (43) to a second bobbin (44) a feeder shaft (34) of the feeding motor (32) and a capstan shaft (35) of the coiling motor (33) which are connected directly with motors (32) (33) and both projected from the outer surface of housing (31), and a pair of vacuum grippers (36) (37) which are disposed with the housing (31) and between the above two shafts (34) (35). The work piece feeding mechanism is connected with a drive mechanism (4) movably toward the x-axis.

As to the above motors (32) (33), it is one aspect of the present invention to control each so as to synchronize each other's rotation in a reciprocal proportion in response to an increase or decrease of each web's diameter according to the progress of piercing work. Another aspect for controlling the motors, is to drive only the capstan shaft (35) by the coiling motor (33) and the other feeder shaft (34) is left as an idler shaft with an adequate frictional resistance without any drive source.

The drive mechanism (4) is provided to move the work piece (9) in either the x-axis or y-axis, or in both the x-axis and y-axis direction through the work piece feeding section (3), which consists of a x-axis drive mechanism (41) and a y-axis drive mechanism (42). The x-axis drive mechanism (41) is provided to move the work piece feeding mechanism (3) toward the x-axis direction, which consists of a second housing (41a) arranged in the x-axis direction, a jack-screw shaft (41b) disposed in second housing (41a), a x-axis motor (41c) connected with the jack-screw shaft (41b) to rotate the shaft (41b) for traversing the punch press frame section (2) in the x-axis direction, and a screw cursor (41d) to engage with jack-screw shaft (41b) for supporting the second housing (31) of the work piece feeding mechanism (3). The x-axis drive mechanism (41) is arranged movably on a y-axis drive mechanism (42). The y-axis drive mechanism (42) is provided to move the x-axis drive mechanism (41) in the y-axis direction; and consists of a jack-screw shaft (42b) engaging with a screw cursor (42a), which supporting the second housing (41a) of the x-axis drive mechanism (41), with a y-axis motor (42c) connected with the jack-screw shaft (42b) for rotating shaft (42b), in which the y-axis motor (42c), being fixed with the bed (1) and two pieces of guide pins (42d) (42e) which are fixed with the bed (1), guide the second housing (41a) of the x-axis drive mechanism (41) in engaging with the second housing (41a).

A control section (B) consists of: a console body (5) housed with a microcomputer; which consists of a display panel (6) connected with a keyboard (7) and applied on the console body (5); further connected with an offset type microscope (8) which is disposed adjacent the punch press frame section (2) for automatically controlling the piercing operation of punch press frame section (2) with a pre-programmed operation, as described later in this description.

Figure 4:
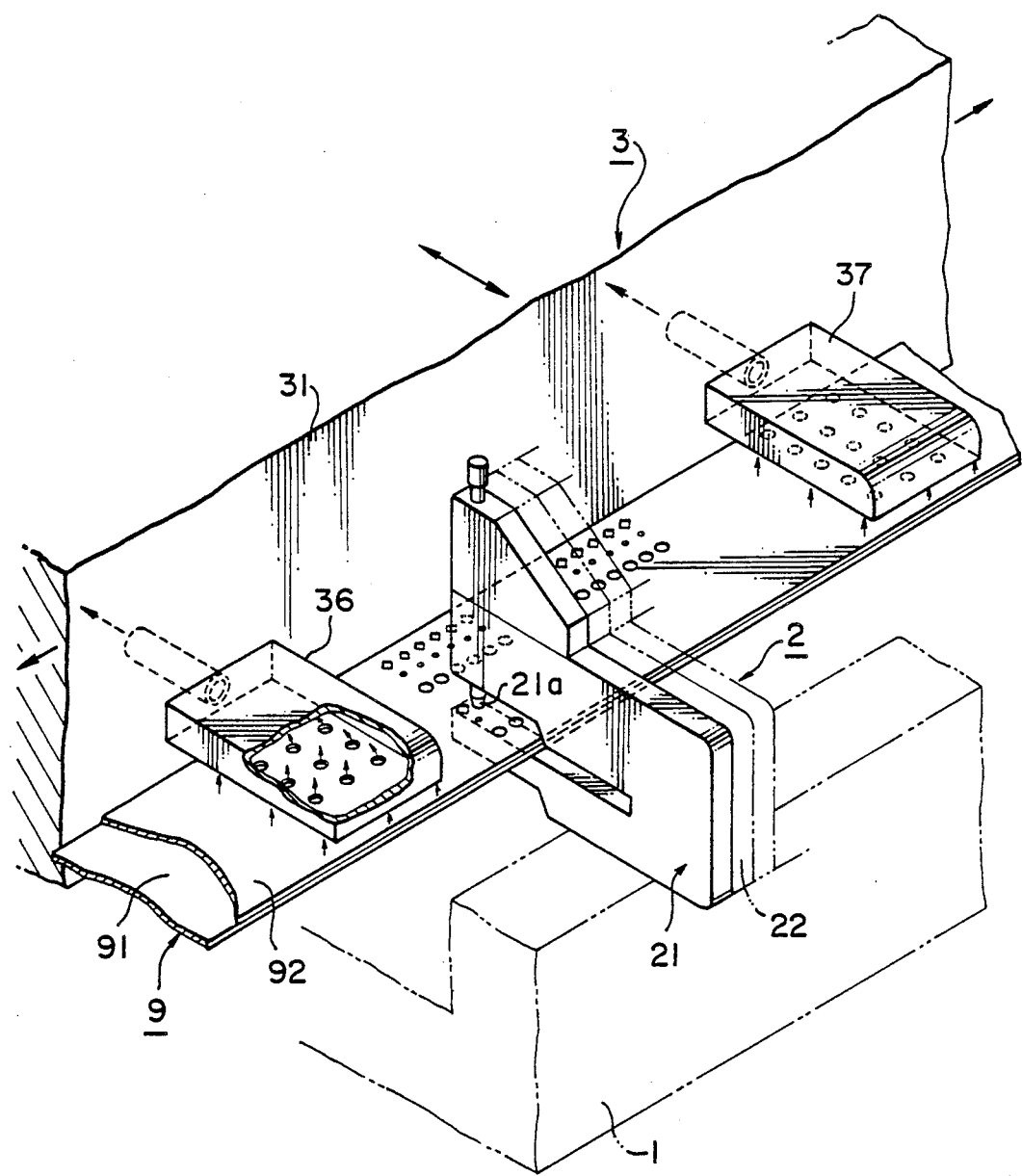
FIG. 4 is a partially enlarged perspective illustration.
Figure 5:
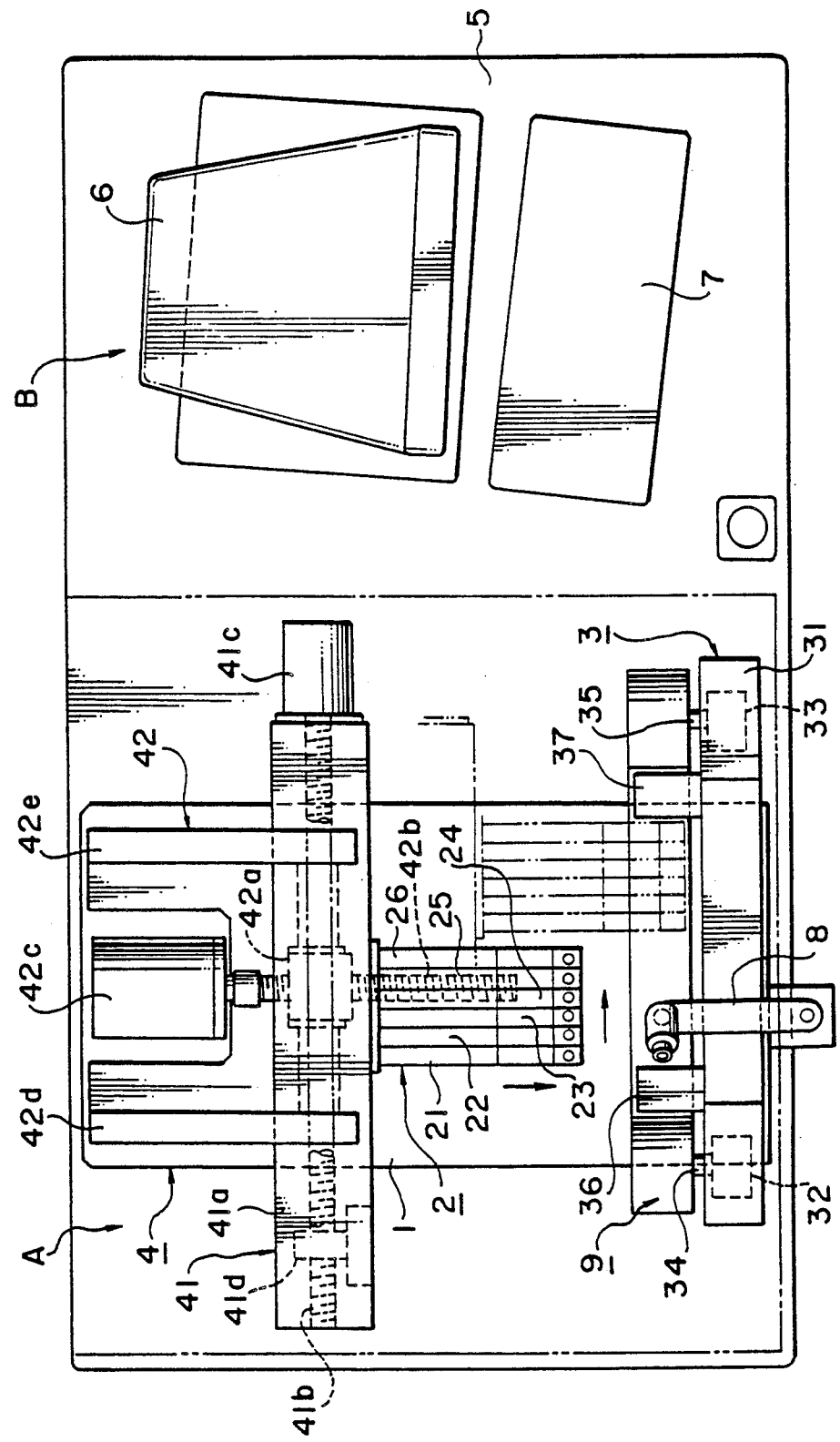
FIG. 5 is a plan view for showing another practical example of the punch press.
Figure 6:
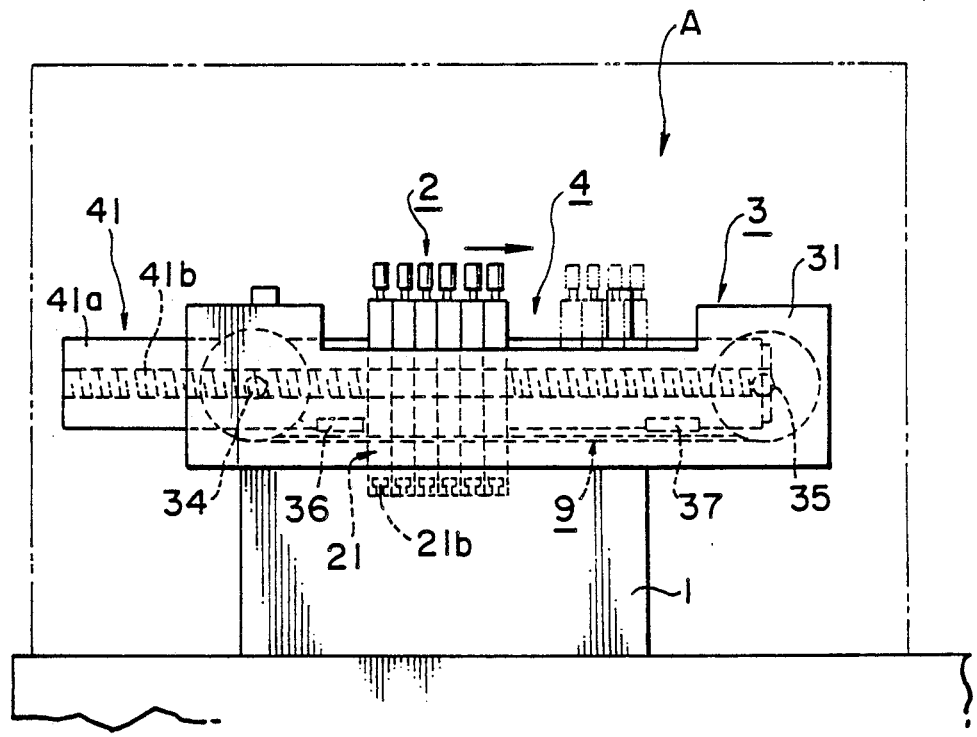
FIG. 6 is a partial front elevation of FIG. 5.
Figure 7:
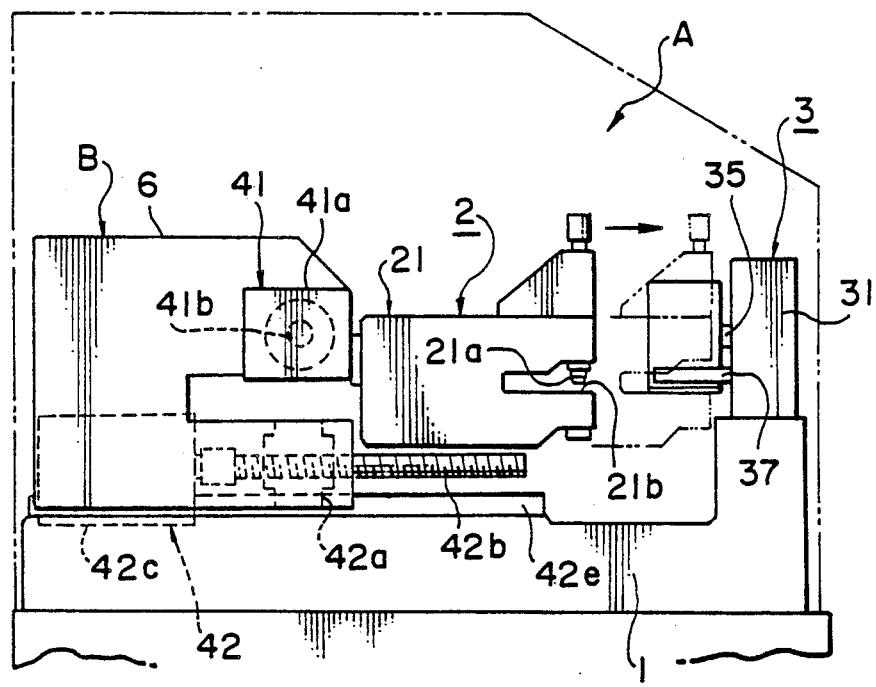
FIG. 7 is a side view of FIG. 5.
Figure 8:
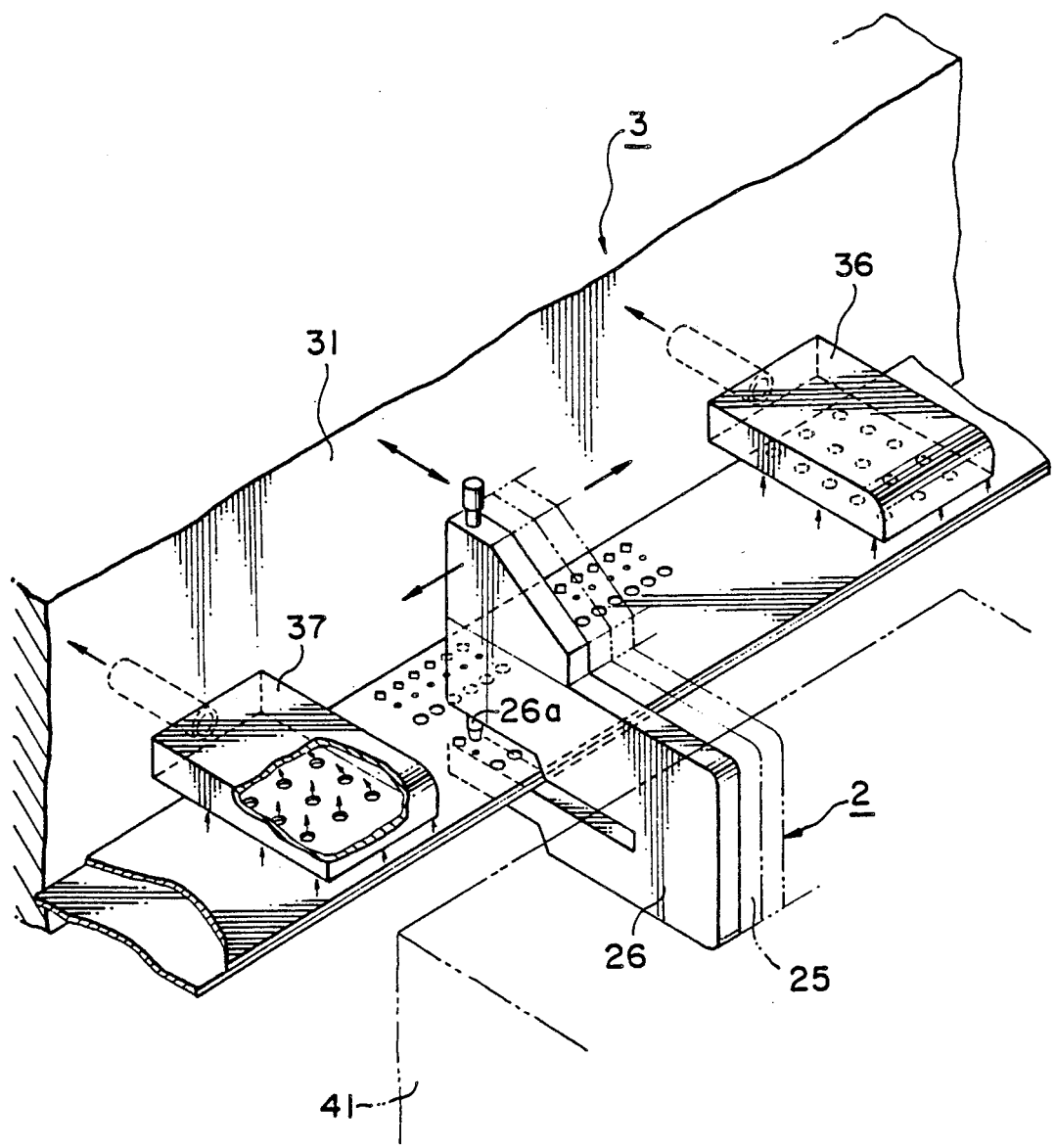
FIG. 8 is a partially enlarged perspective illustration, and reference mark (2) shows a punch press frame section, a of series numbers (21), (22), (23), (24), (25) and (26) show a piercing assembly having piercing punches and female dies which are built-in, a mark (3) shows a green-sheet feeding mechanism and a mark (9) shows a green sheet itself.

Referring to FIG. 4, the green sheet (9) consists of a ceramic compound layer (92) coated on a tape (91) with a predetermined thickness, uniformly and then dried. The green sheet (9) is then webbed at feeder web shaft (34) in order to stretch the sheet (9) onto the coiling shaft (35). The sheet (9) is held by vacuum grippers (36) (37) so as to be tensioned between both grippers (36) (37), so that it can keep its shape as a flat sheet.

The thickness of green sheet (9) consists of 0.1 mm (millimeter) of the ceramic layer (92) and 0.3 mm of the polyester resin film tape, therefore, its total thickness is 0.4 mm.

In an operation of piercing the sheet (9), firstly desirable data is input into the microcomputer console (5) to set up a preferable piercing position and the selection of piercing assemblies (21), (22), (23), (24), (25) and (26). Secondly, the green sheet which is held by the vacuum grippers (36) (37) and is transferred into the punch press frame section (2) by the drive mechanism (4) and held effectively. Thirdly, the piercing work is performed with various forms under the detection of the offset type microscope (8), which relays information to the console (5), for control commands, fixed adjacent the punch press frame section (2).

According to the input data into the microcomputer console (5), ti is possible to feed an unprocessed blank sheet without any piercing work by an adequate drive of the feeding motor (32) and the coiling motor (33) as an optical example. In addition, although not illustrated in the drawings of the above practical example, as further optional example, the sheet could be fed by means of an actuator such as an air cylinder and the like into the structure of drive mechanism (4). As to the control section (B), it is not always necessary to use automatic control. Instead, manual control without the control section (B) or, adoption of a two way system capable of switching either to a manual operation or an automatic operation can be applied.

As an additional modification as to the drive mechanism (4), referring to the x-axis mechanism (41) and y-axis mechanism (42) noted above, ti is suggested to add one more necessary drive mechanism into the drive section of this punch press machine, that is, a z-axis drive mechanism which is capable of elevating vertically, an objective section, such as either the punch press frame section or the work piece feeding section, and then operating these three mechanisms in charge of each x, y and z-axis selectively or simultaneously. It is noted that this z-axis drive mechanism is particularly effective for keeping a level position of the work piece between the guide slit of piercing assemblies during the piercing operation, although the feature of z-axis mechanism is not shown specially in the drawings of the disclosure.

In summary from the above practical example, FIG. 1 to FIG. 4, refer to a punch press for green sheet in combination with a stationary punch press frame section (2) and a movable feeding section (3).

In another practical example, shown in FIG. 5 to FIG. 8 illustrate combination of a movable punch press frame section (2) and a stationary feeding mechanism (3).

In FIG. 5 to FIG. 8, the structural difference between this practical example and the first practical example is possession of the drive mechanism (4) which comes under the punch press frame section (2) in the second practical example. In other words, it is only that the drive mechanism (4) has been removed into the punch press frame section (2) from the work piece feeding mechanism (3).

For reason of convenience, the reference numbers or marks of the drawings, FIG. 5 to FIG. 8, will follow to the former drawings FIG. 1 to FIG. 4 as common designation in both.

In practice, the punch press frame section (3) is arranged fixedly on the bed (1). The drive mechanism (4) is a device to move the punch press frame section (2) in the x-axis direction or y-axis direction or in both directions; and which consists of the x-axis drive mechanism (41) and Y-axis drive mechanism (42). The x-axis drive mechanism (41) is a device to move the punch press frame mechanism (2) in the x-axis direction, which consists of the housing (41a) arranged in the x-axis direction and fixed with the punch press frame section (2), jack-screw shaft (41b) fixed in housing (41a), the x-axis motor (41c) connected with the jack-screw shaft (41b) to rotate the shaft (41b), and the screw cursor (41d) engaged with the jack-screw shaft (41b) and fixed with housing (41a).

In this way, the punch press frame section (2) is moved by the drive mechanism (4) against the green sheet (9), wherein the green sheet (9) is held effectively into the punch press frame section (2). The necessary data for the piercing position using the offset type microscope (8) or the selective movement of piercing assemblies such as (21), (22), (23), (24), (25) and (26), are input into the microcomputer of console (5) of control section (B). According to this input data, the piercing work is performed.

An advantage to this second practical example, that is, the combination wit the movable punch press frame section (2) and the stationary mechanism (3), is described herein. The piercing is performed in various piercing forms upon the green sheet. In these various perforations, it is found that there is a trend that delicate errors occur upon the products at times when a comparatively complex perforation is performed. After due search, it is found that these errors might be caused by an inertia generated by the quick action of movable feeding mechanism (3) against the work piece, which is static, unless the moving speed is reduced. In view of this result, it is advantageous to use the second practical example when a complex perforation is performed.

According to the above described two practical examples, since a green sheet is fed into a punch press frame section without peeling off an attached tape from the green sheet, the invention can provide an improved type punching press capable facilitating the piercing work of green sheet. Thus it is possible to obtain further high grade products as well as improvement of productivity.

It is to be understood that the present invention is not limited in its application to the details of construction and arrangement of parts illustrated in the accompanying drawings, since the invention is capable of other embodiments and of being practiced or carried out in various ways. Also it is to be understood that the phraseology or terminology employed herein is for the purpose of description and not of limitation.

What is claimed is:

1. A punch press for piercing a green sheet having a liner, comprising:
   a punch press frame and a plurality of piercing assemblies provided with a number of punches and corresponding female dies carried by said punch press frame;
   a feeding mechanism further comprising means for feeding a first web of said green sheet from a first bobbin, means for coiling said green sheet onto a second bobbin, thereby forming a second web, and means for holding and tensioning said green sheet between said means for feeding and said means for coiling; and
   means for moving one of said punch press and said feeding mechanism selectively in a first direction, a second direction, or both said first and second directions.

2. A punch press according to claim 1, wherein said means for moving further comprises means for moving said punch press frame, and wherein said feeding mechanism is stationary.

3. A punch press according to claim 1, wherein said means for moving further comprises means for moving said feeding mechanism, and wherein said punch press frame is stationary.

4. A punch press according to claim 1, wherein said means for feeding comprises means for intermittently feeding said green sheet into said punch press frame.

5. A punch press according to claim 1, wherein said means for holding and tensioning said green sheet comprises a pair of vacuum grippers disposed between said first web and said second web.

6. A punch press according to claim 1, wherein said piercing assemblies comprise a guide slit between said piercing punches and said female dies for receiving said green sheet.

7. A punch press according to claim 1, wherein said drive mechanism comprises means for controlling the rate at which said green sheet is fed to said piercing assemblies, further comprising means for controlling said rate to be reciprocally proportional to a decrease and increase of the diameters of said first web and said second web on said first bobbin and said second bobbin, respectively, thereby providing a constant tension between said first web and said second web.

8. A punch press according to claim 1, wherein said means for feeding and said means for coiling are directionally reversible allowing said green sheet to be fed in forward and reverse directions.

9. A punch press according to claim 1, further comprising means for controlling said piercing assemblies, said feeding mechanism, and said moving means.

10. A punch press according to claim 9, wherein said controlling means comprises a microcomputer which is programmed for controlling said drive mechanism, said means for feeding, and said means for coiling, and wherein said controlling means further comprises an offset-type microscope located adjacent to said punch press frame for supplying information to said microcomputer.

11. A punch press according to claim 10, wherein said means for feeding further comprises a feeder shaft driven by a feed motor, further wherein said first bobbin is fitted to said feeder shaft.

12. A punch press according to claim 10, wherein said microcomputer is connected to said feed motor.

13. A punch press according to claim 10, wherein said means for coiling further comprises a capstan shaft driven by coiling motor, further wherein said second bobbin is fitted to said capstan shaft.

14. A punch press according to claim 13, wherein said coiling motor is controlled by said microcomputer.

15. A punch press according to claim 13, wherein said capstan shaft is driven and said feed shaft is idle with adequate frictional resistance to maintain tension between said first web and said second web.

16. A punch press apparatus for piercing a green sheet having a liner, comprising:
   (a) means for supporting a plurality of punching assemblies;
   (b) means for feeding said green sheet with a liner proximate said plurality of punching assemblies for enabling said plurality of punching assemblies to pierce said green sheet and liner; and (c) means for moving one of (i) said supporting means and (ii) said feeding means in a first direction and a second direction relative to the other of said supporting means and said feeding means.

17. A punch press apparatus according to claim 16, wherein said first direction and said second direction are an x-axis direction and a y-axis direction.

18. A punch press apparatus according to claim 16, wherein said feeding means further comprises a feed motor with a feed shaft onto which said first web of green sheet with liner is secured.

19. A punch press apparatus according to claim 16, wherein said feeding means further comprises means for receiving said green sheet with liner subsequent to a piercing operation performed by said plurality of punching assemblies.

20. A punch press according to claim 19, wherein said means for receiving further comprises a motor with a capstan shaft for coiling said green sheet and liner into a second web subsequent to said piercing operation.

21. A punch press apparatus according to claim 16, wherein said feeding means further comprises means for holding said green sheet with liner.

22. A punch press apparatus according to claim 21, wherein said means for holding comprises a vacuum gripper disposed on an infeed side and a vacuum gripper disposed on an outfeed side of said plurality of punching assemblies.

23. A punch press apparatus according to claim 16, further comprising means for controlling and synchronizing said piercing assemblies, said feeding means, and said moving means.

\* \* \* \* \*

UNITED STATES PATENT AND TRADEMARK OFFICE
CERTIFICATE OF CORRECTION

PATENT NO. : 4,990,080
DATED : February 5, 1991
INVENTOR(S) : M. KAKIMOTO

It is certified that error appears in the above-indentified patent and that said Letters Patent is hereby corrected as shown below:

At column 1, line 37, ---(--- should be inserted after "thin".

At column 1, line 40, ---,--- should be inserted after "productivity".

At column 1, line 50, "a" (second occurrence) should be deleted.

At column 1, lines 53-54, ---:--- should be inserted after "comprises".

At column 1, line 55, ---(male)--- should be inserted after "punches".

At column 1, line 55, "have" should be ---having---.

At column 1, line 59, ---a--- should be inserted after ";".

At column 2, line 17, ---of--- should be inserted after "example".

At column 2, line 37, "be made now" should be ---now be made---.

At column 2, line 51, "consists" should be ---consist---.

At column 2, line 53, "numbers" should be ---number---.

At column 3, line 1, ---a--- should be inserted after "from".

At column 3, line 2, ---,--- should be inserted after "(44)".

UNITED STATES PATENT AND TRADEMARK OFFICE
CERTIFICATE OF CORRECTION

PATENT NO. : 4,990,080
DATED : February 5, 1991
INVENTOR(S) : M. KAKIMOTO

It is certified that error appears in the above-indentified patent and that said Letters Patent is hereby corrected as shown below:

At column 3, line 46, delete space after "(41a".

At column 4, line 14, "ti" should be ---it---.

At column 4, line 17, "optical" should be ---optional---.

At column 4, line 18, ---a--- should be inserted after "as".

At column 4, line 26, ---,--- should be inserted after "operation".

At column 4, line 29, "ti" should be ---it---.

At column 5, line 14, ---,--- should be inserted after "position".

Signed and Sealed this

First Day of August, 1995

Attest:

Attesting Officer

BRUCE LEHMAN

Commissioner of Patents and Trademarks